United States Patent
Moschiano et al.

(10) Patent No.: US 12,205,653 B2
(45) Date of Patent: Jan. 21, 2025

(54) WORDLINE OR PILLAR STATE DETECTION FOR FASTER READ ACCESS TIMES

(71) Applicant: Micron Technology, Inc., Boise, ID (US)

(72) Inventors: Violante Moschiano, Avezzano (IT); Shyam Sunder Raghunathan, Singapore (SG); Walter Di Francesco, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 213 days.

(21) Appl. No.: 18/083,304

(22) Filed: Dec. 16, 2022

(65) Prior Publication Data

US 2023/0197169 A1    Jun. 22, 2023

Related U.S. Application Data

(60) Provisional application No. 63/292,665, filed on Dec. 22, 2021.

(51) Int. Cl.
*G11C 16/32* (2006.01)
*G11C 16/08* (2006.01)
*G11C 16/10* (2006.01)

(52) U.S. Cl.
CPC .............. *G11C 16/32* (2013.01); *G11C 16/08* (2013.01); *G11C 16/102* (2013.01)

(58) Field of Classification Search
CPC ....... G11C 16/32; G11C 16/08; G11C 16/102; G11C 16/0483; G11C 16/26; G11C 8/08
USPC ....................................................... 365/233.1
See application file for complete search history.

(56) References Cited

U.S. PATENT DOCUMENTS 10,685,718 B2 *   6/2020   Palmer .................. G06F 3/0611

\* cited by examiner

*Primary Examiner* — Huan Hoang
(74) *Attorney, Agent, or Firm* — Lowenstein Sandler LLP

(57) ABSTRACT

A memory device includes an array of memory cells arranged in sub-blocks. Memory cells of a sub-block are coupled to a pillar of the array and are associated with multiple wordlines. To perform a read operation, control logic coupled with the array performs operations including: tracking a length of time that a selected wordline takes to reach a pass voltage before being able to read data from a memory cell associated with the selected wordline; in response to the length of time satisfying a first threshold criterion, causing a first delay time to pass before reading the data; and in response to the length of time satisfying a second threshold criterion that is longer than the first threshold criterion, causing a second delay time to pass before reading the data, the second delay time being longer than the first delay time.

20 Claims, 9 Drawing Sheets

WORDLINE OR PILLAR STATE DETECTION FOR FASTER READ ACCESS TIMES

CLAIM OF PRIORITY

The present application claims the benefit under 35 U.S.C. § 119(e) of U.S. Provisional Patent Application No. 63/292,665 filed Dec. 22, 2021, which is incorporated by reference herein.

TECHNICAL FIELD

Embodiments of the disclosure relate generally to memory sub-systems, and more specifically, relate to wordline or pillar state detection for faster read access times in a memory device of a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1A:
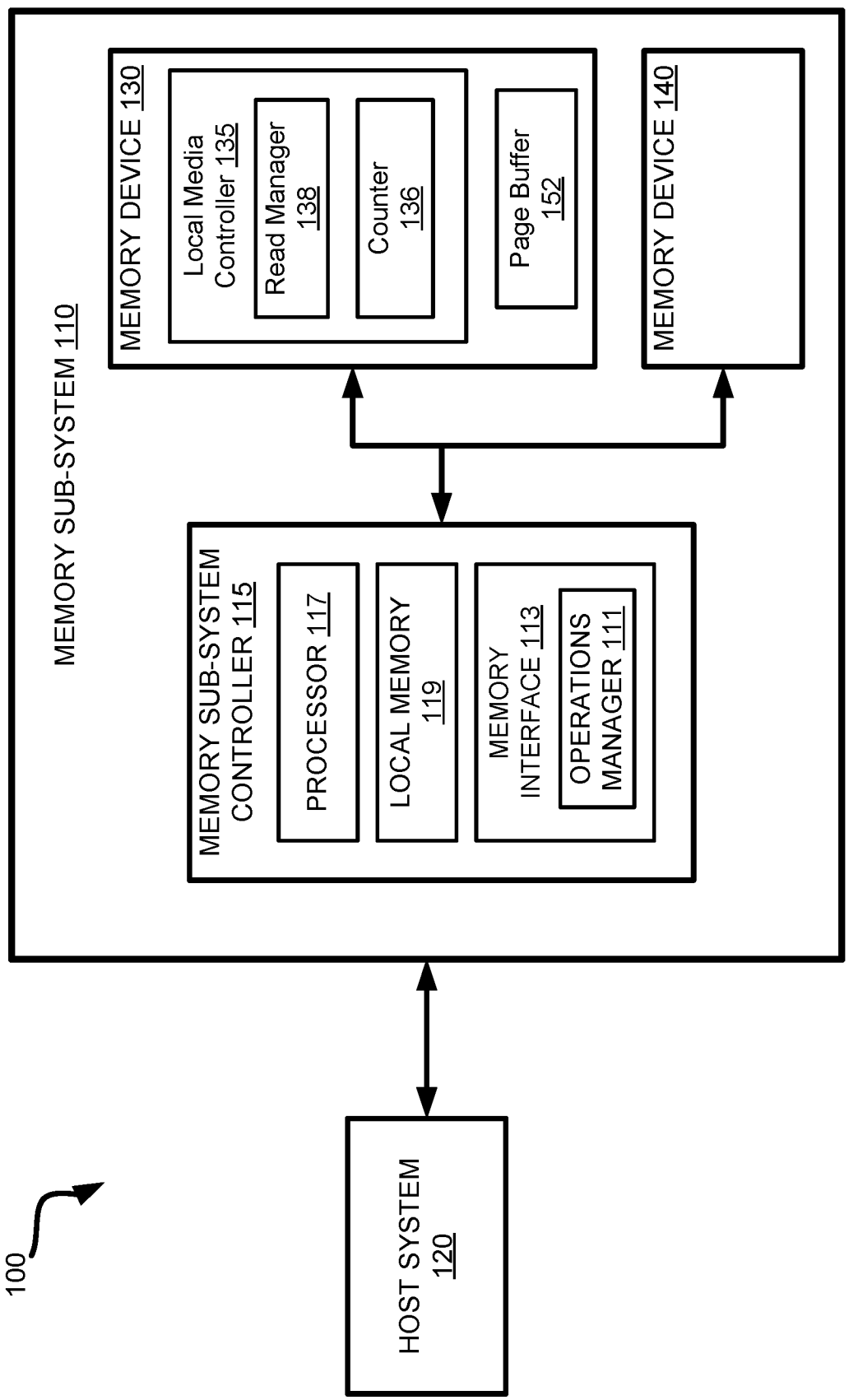
FIG. 1A illustrates an example computing system that includes a memory sub-system in accordance with some embodiments.

Aspects of the present disclosure are directed to detection of wordline or pillar state for faster read access times in a memory device. In certain memory devices, including non-volatile memory devices such as negative-and (NAND) memory devices, read access time (tR) is generally determined by three phases of read accesses. These phases include, for example, a pass voltage (Vpass) time in which voltages of the wordlines of an array of memory cells are ramped up, a sensing time to perform the actual read of data stored in the memory cells of the array, and a prologue or epilogue time in which the voltage levels are at least partially discharged or other type of recovery from the read operation is performed.

Further, in many memory devices, the array load increases at a per-node basis because of an increased number of wordlines coupled to the same bitline and/or source lines of the array of memory cells associated with advancing memory technology. Further, in certain multi-plane memory devices, the number of planes to which simultaneous access is possible has increased, further burdening the memory device in terms of wordline-related load. Thus, the array load is becoming a limiting factor in further reducing read access times.

In these memory devices, the Vpass time is the time used by the array in order to ramp the wordlines associated with memory cells of the array to Vpass, e.g., which can be between 5-10 volts (V) in different devices or applications. This Vpass level of the wordlines enable subsequent selection of a wordline for actual data sensing. In some implementations, all sub-blocks of the array of memory cells are loaded during the Vpass time to avoid hot-e issues. More specifically, the wordlines can be boosted during the Vpass ramp up after a pillar of the array is floated. While pillar (or three-dimensional memory) is generally referenced herein, it should be understood that this disclosure is equally applicable to channels of two-dimensional memory, and thus "channel" can be understood to be synonymous with "pillar" in this disclosure. The pillar can be a common pillar shared with a string of memory cells within the sub-block, for example. The pillar potential of sub-blocks can be modulated by the timing of signals sent to the source select and drain select lines (SGS/SGD) that are coupled to SGS/SGD transistors.

The challenge is, however, that wordline resistive-capacitive (RC) variations, SGS/SGD transistor threshold voltage (Vt) differences, and SGS/SGD resistive-capacitive variations make it difficult to accurately control the pillar potential. An inability to control the pillar potential causes instances of hot carrier injection (or "hot-e") into the pillar, e.g., due to localized potential differences surrounding selected wordlines, even in unselected sub-blocks that share the selected wordlines. This boosting takes time, as does delay times added to the Vpass time period while waiting for the wordlines to fully reach Vpass. Accordingly, internal timing and parameters are generally defined by assuming the most critical condition (e.g., the pillar being in a more neutral state) for hot-e and the timing is set based on assuming existence of this critical condition. Making this assumption means that delays added to the Vpass period are often too long and cause unnecessary increases in read access times of memory cells.

Aspects of the present disclosure address the above and other deficiencies of overly-delayed Vpass periods by determining a state of a selected wordline in the memory device and dynamically choosing which of multiple delay times to add to a Vpass period before sensing actual data at the memory cell associated with the selected wordline. In this way, the delay is customized to the state of the pillar or channel of the memory cell associated with the selected wordline.

More specifically, hot-e is generally more severe in scenarios in which the pillar is in a stable state (e.g., pillar is at a neutral or generally zero voltage), which is not the most common condition for memory arrays. In contrast, hot-e is generally less severe in scenarios in which the pillar is in a transient state, e.g., a negative voltage, where boosting the wordlines does not appreciably boost the pillar voltage into a range otherwise associated with enhanced hot-e risk. The pillar is often allowed to stay in this transient state after an initial read operation is performed at the array of memory cells, so most often a shorter delay is appropriate, as will be explained in more detail.

Thus, according to at least some embodiments, control logic of a memory device can perform additional operations to customize the delay time added to the end of a Vpass time period. These operations can include, for example, tracking a length of time that a selected wordline takes to reach a pass voltage (Vpass) before being able to read data from a memory cell associated with the selected wordline. The operations can further include, in response to the length of time satisfying a first threshold criterion (e.g., associated with a transient state), causing a first delay time to pass before reading the data from the memory cell. Or, in response to the length of time satisfying a second threshold criterion that is longer than the first threshold criterion, the operations can include causing a second delay time to pass before reading the data from the memory cell, where the second delay time is longer than the first delay time. In additional embodiments, more than two delay times are employed for several granular lengths of time required for a selected wordline to reach Vpass.

Advantages of this approach include, but are not limited to, improved read access time (tR) performance of memory devices. In the manner described herein, the performance improvement can be between approximately 6-24% faster read access times depending on whether the memory cells are single-level cells (SLC) or triple-level cells (TLC), for example. These and other advantages apparent to those skilled in the art of memory programming will be discussed in detail below.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such media or memory devices. The memory sub-system 110 can be a storage device, a memory module, or a hybrid of a storage device and memory module.

The memory device 130 can be a non-volatile memory device. One example of non-volatile memory devices is a negative-and (NAND) memory device. A non-volatile memory device is a package of one or more dice. Each die can include one or more planes. Planes can be groups into logic units (LUN). For some types of non-volatile memory devices (e.g., NAND devices), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1," or combinations of such values.

The memory device 130 can be made up of bits arranged in a two-dimensional or three-dimensional grid, also referred to as a memory array. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface, Open NAND Flash Interface (ONFI) interface, or some other interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include NOT-AND (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), NOT-OR (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. Thus, the control logic of the local media controller 135 is operatively coupled with an array of memory cells, which will be discussed in more detail with reference to FIG. 1B. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113, which includes an operations manager 111. The memory interface component 113 is responsible for handling interactions of the memory sub-system controller 115 with the memory devices of memory sub-system 110, such as memory device 130. For example, the memory interface component 113 can send memory access commands corresponding to requests received from the host system 120 to the memory device 130, such as program commands, read commands, or other commands. In addition, the memory interface component 113 can receive data from the memory device 130, such as data retrieved in response to a read command or a confirmation that a program command was successfully performed.

In some embodiments, the memory sub-system controller 115 includes at least a portion of the operations manager 111. For example, the memory sub-system controller 115 can include a processor 117 (e.g., a processing device) configured to execute instructions stored in local memory 119 for performing the operations described herein. In some embodiments, the memory interface component 113 is part of the host system 120, an application, or an operating system. In one embodiment, memory interface 113 includes an operations manager 111, among other sub-components. The operations manager 111 can direct memory access commands, such as a read command, a cache read command, a snap read command, a cache read context switch command, or a cache reach context restore command, to the memory device 130.

In one embodiment, the local media controller 135 includes a read manager 138 and a counter 136 and the memory device 130 includes a page buffer 152 of multiple page buffers that store data temporarily (e.g., buffered) while data is being either programmed to or read from memory cells of the memory device 130. In these embodiments, the read manager 138 can direct read operations that customize a delay time between a Vpass period and a sense period depending on the state of the pillar of a selected sub-block or a wordline of a selected memory cell, as will be discussed in more detail. The counter 136 can be employed to track the time period of ramping up the Vpass voltage, e.g., to determine the state of the pillar of wordline. Additional details with regards to the operations of the operations manager 111 and read manager 138 are described below.

Figure 1B:
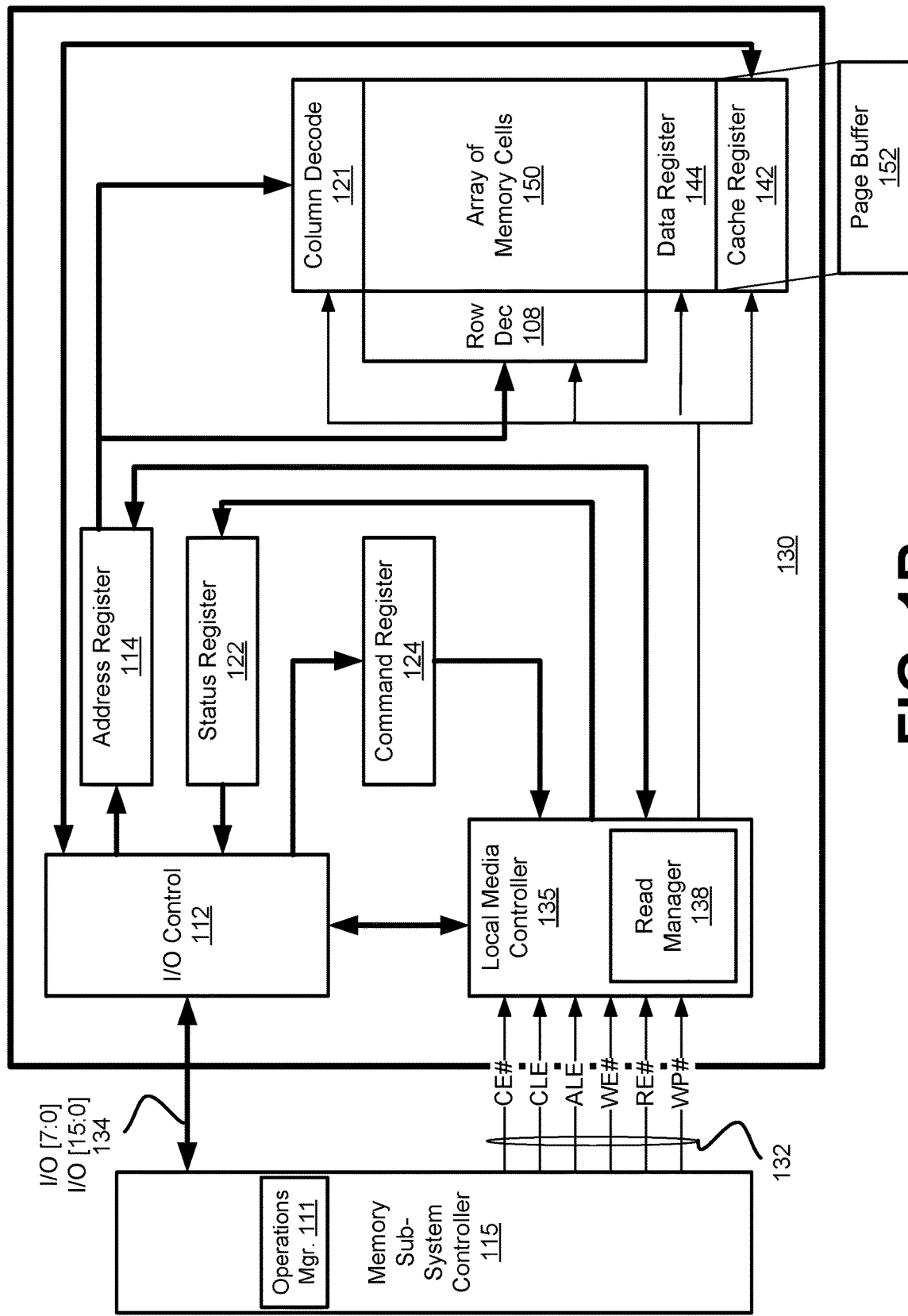
FIG. 1B is a block diagram of a memory device in communication with a memory sub-system controller of a memory sub-system according to an embodiment.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 150 logically arranged in rows and columns. Memory cells of a logical row are typically connected to the same access line (e.g., a word line) while memory cells of a logical column are typically selectively connected to the same data line (e.g., a bitline). A single access line may be associated with more than one logical row of memory cells and a single data line may be associated with more than one logical column. Memory cells (not shown in FIG. 1B) of at least a portion of array of memory cells 150 are capable of being programmed to one of at least two target data states.

Row decode circuitry 108 and column decode circuitry 121 are provided to decode address signals. Address signals are received and decoded to access the array of memory cells 150. Memory device 130 also includes input/output (I/O) control circuitry 112 to manage input of commands, addresses and data to the memory device 130 as well as output of data and status information from the memory device 130. An address register 114 is in communication with I/O control circuitry 112 and row decode circuitry 108 and column decode circuitry 121 to latch the address signals prior to decoding. A command register 124 is in communication with I/O control circuitry 112 and local media controller 135 to latch incoming commands.

A controller (e.g., the local media controller 135 internal to the memory device 130) controls access to the array of memory cells 150 in response to the commands and generates status information for the external memory sub-system controller 115, i.e., the local media controller 135 is configured to perform access operations (e.g., read operations, program operations and/or erase operations) on the array of memory cells 150. The local media controller 135 is in communication with row decode circuitry 108 and column decode circuitry 121 to control the row decode circuitry 108 and column decode circuitry 121 in response to the addresses. In one embodiment, local media controller 135 includes the read manager 138, which can implement read operations at a faster read access time as described herein.

The local media controller 135 is also in communication with a cache register 142. Cache register 142 latches data, either incoming or outgoing, as directed by the local media controller 135 to temporarily store data while the array of memory cells 150 is busy writing or reading, respectively, other data. During a program operation (e.g., write operation), data may be passed from the cache register 142 to the data register 144 for transfer to the array of memory cells 150; then new data may be latched in the cache register 142 from the I/O control circuitry 112. During a read operation, data may be passed from the cache register 142 to the I/O control circuitry 112 for output to the memory sub-system controller 115; then new data may be passed from the data register 144 to the cache register 142. The cache register 142 and/or the data register 144 may form (e.g., may form a portion of) a page buffer 152 of the memory device 130. The page buffer 152 may further include sensing devices (not shown in FIG. 1B) to sense a data state of a memory cell of the array of memory cells 150, e.g., by sensing a state of a data line connected to that memory cell. A status register 122 may be in communication with I/O control circuitry 112 and the local media controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 142. The data may be subsequently written into data register 144 for programming the array of memory cells 150.

In an embodiment, cache register 142 may be omitted, and the data may be written directly into data register 144. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2A:
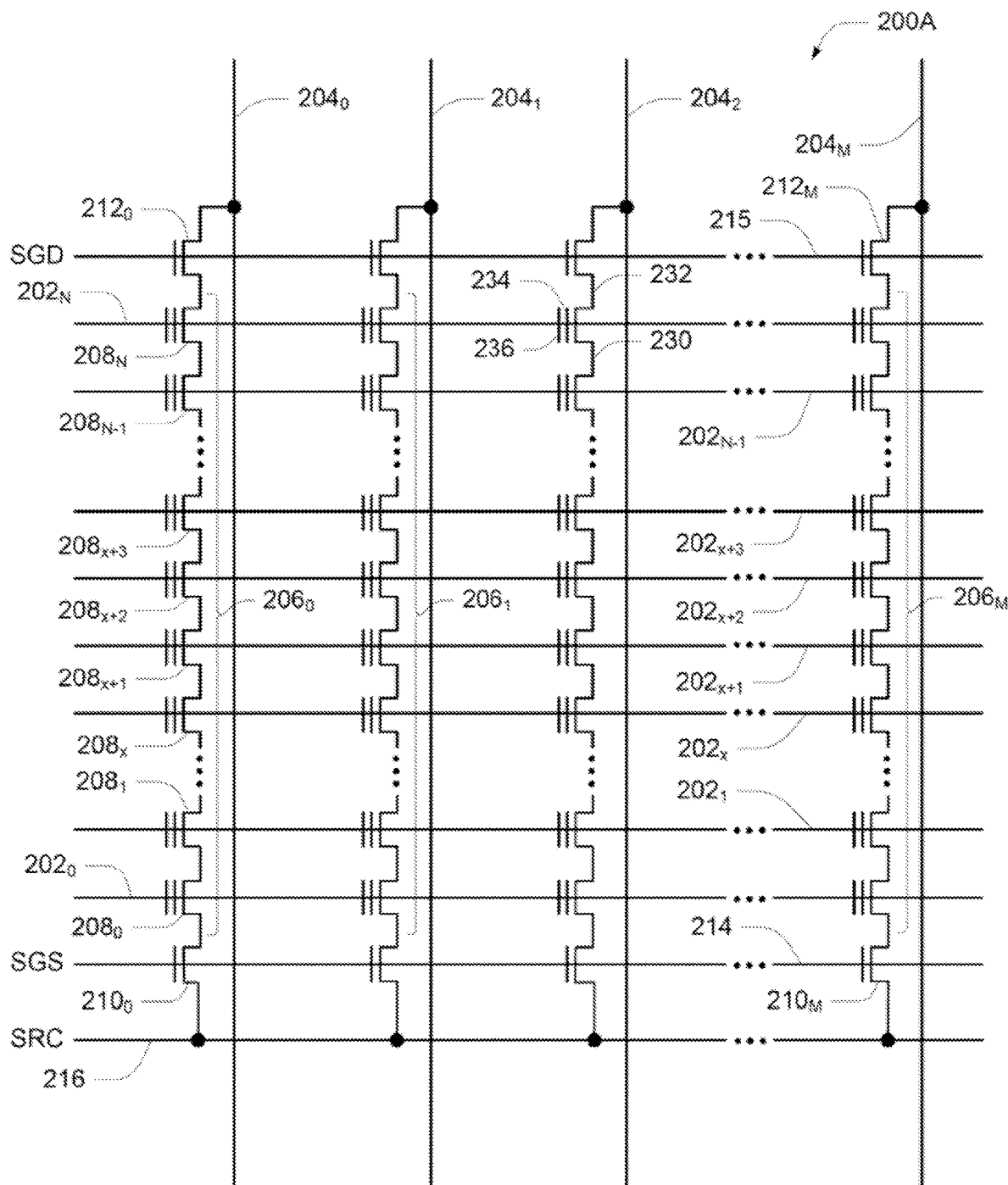
FIG. 2A-2C are schematics of portions of an array of memory cells as could be used in a memory of the type described with reference to FIG. 1B according to an embodiment.
Figure 2B:
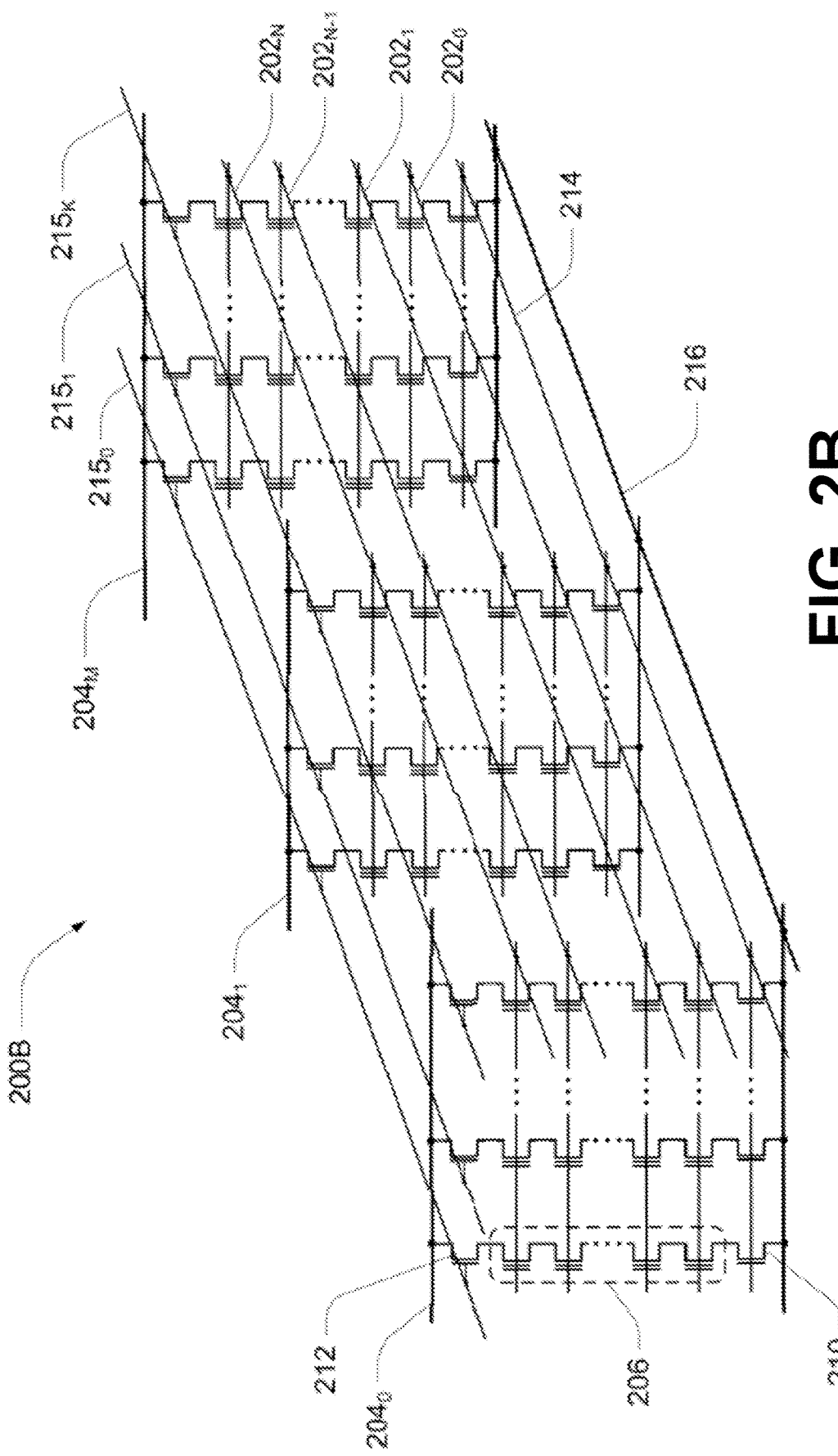
Figure 2C:
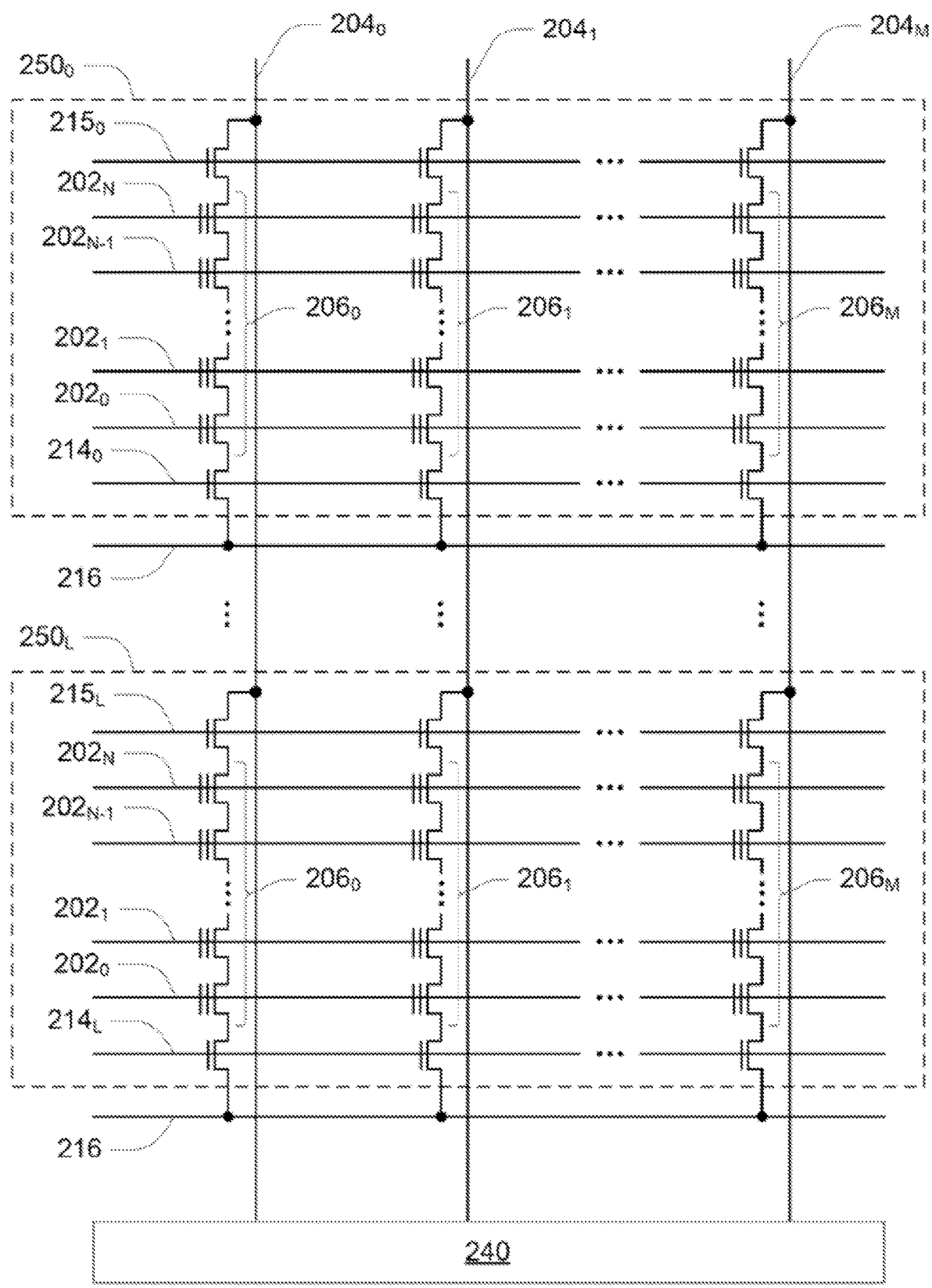

FIG. 2A-2C are schematics of portions of an array of memory cells 200A, such as a NAND memory array, as could be used in a memory of the type described with reference to FIG. 1B according to an embodiment, e.g., as a portion of the array of memory cells 104. Memory array 200A includes access lines, such as word lines $202_0$ to $202_N$, and data lines, such as bitlines $204_0$ to $204_M$. The word lines 202 can be connected to global access lines (e.g., global word lines), not shown in FIG. 2A, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n-well.

Memory array 200A can be arranged in rows (each corresponding to a word line 202) and columns (each corresponding to a bitline 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. Each NAND string 206 can also be referred to as a sub-block of memory cells. Thus, the memory array 200A can be said to include multiple sub-blocks, e.g., physical sub-blocks of memory cells.

In at least some embodiments, the memory cells 208 represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bitline 204 for the corresponding NAND string 206. For example, the drain of select gate $212_0$ can be connected to the bitline $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bitline 204. A control gate of each select gate 212 can be connected to select line 215.

The memory array 200A in FIG. 2A can be a quasi-two-dimensional memory array and can have a generally planar structure, e.g., where the common source 216, NAND strings 206 and bitlines 204 extend in substantially parallel planes. Alternatively, the memory array 200A in FIG. 2A can be a three-dimensional memory array, e.g., where NAND strings 206 can extend substantially perpendicular to a plane containing the common source 216 and to a plane containing the bitlines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2A. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a word line 202.

A column of the memory cells 208 can be a NAND string 206 or a number of NAND strings 206 selectively connected to a given bitline 204. A row of the memory cells 208 can be memory cells 208 commonly connected to a given word line 202. A row of memory cells 208 can, but need not, include all the memory cells 208 commonly connected to a given word line 202. Rows of the memory cells 208 can often be divided into one or more groups of physical pages of memory cells 208, and physical pages of the memory cells 208 often include every other memory cell 208 commonly connected to a given word line 202. For example, the memory cells 208 commonly connected to word line $202_N$ and selectively connected to even bitlines 204 (e.g., bitlines $204_0$, $204_2$, $204_4$, etc.) can be one physical page of the memory cells 208 (e.g., even memory cells) while memory cells 208 commonly connected to word line $202_N$ and selectively connected to odd bitlines 204 (e.g., bitlines $204_1$, $204_3$, $204_5$, etc.) can be another physical page of the memory cells 208 (e.g., odd memory cells).

Although bitlines $204_3$-$204_5$ are not explicitly depicted in FIG. 2A, it is apparent from the figure that the bitlines 204 of the array of memory cells 200A can be numbered consecutively from bitline $204_0$ to bitline $204_M$. Other groupings of the memory cells 208 commonly connected to a given word line 202 can also define a physical page of memory cells 208. For certain memory devices, all memory cells commonly connected to a given word line can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells. Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 2B is another schematic of a portion of an array of memory cells 200B as could be used in a memory of the type described with reference to FIG. 1B, e.g., as a portion of the array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B can incorporate vertical structures which can include semiconductor pillars where a portion of a pillar can act as a channel region of the memory cells of NAND strings 206. The NAND strings 206 can be each selectively connected to a bitline $204_0$-$204_M$ by a select transistor 212 (e.g., that can be drain select transistors, commonly referred to as select gate drain) and to a common source 216 by a select transistor 210 (e.g., that can be source select transistors, commonly referred to as select gate source). Multiple NAND strings 206 can be selectively connected to the same bitline 204. Subsets of NAND strings 206 can be connected to their respective bitlines 204 by biasing the select lines $215_0$-$215_K$ to selectively activate particular select transistors 212 each between a NAND string 206 and a bitline 204. The select transistors 210 can be activated by biasing the select line 214. Each word line 202 can be connected to multiple rows of memory cells of the memory array 200B. Rows of memory cells that are commonly connected to each other by a particular word line 202 can collectively be referred to as tiers.

FIG. 2C is a further schematic of a portion of an array of memory cells 200C as could be used in a memory of the type described with reference to FIG. 1B, e.g., as a portion of the array of memory cells 104. Like numbered elements in FIG. 2C correspond to the description as provided with respect to FIG. 2A. The array of memory cells 200C can include strings of series-connected memory cells (e.g., NAND strings) 206, access (e.g., word) lines 202, data (e.g., bit) lines 204, select lines 214 (e.g., source select lines), select lines 215 (e.g., drain select lines) and a source 216 as depicted in FIG. 2A. A portion of the array of memory cells 200A can be a portion of the array of memory cells 200C, for example.

FIG. 2C depicts groupings of NAND strings 206 into blocks of memory cells 250, e.g., blocks of memory cells $250_0$-$250_L$. Blocks of memory cells 250 can be groupings of memory cells 208 that can be erased together in a single erase operation, sometimes referred to as erase blocks. Each block of memory cells 250 can represent those NAND strings 206 commonly associated with a single select line 215, e.g., select line $215_0$. The source 216 for the block of memory cells $250_0$ can be a same source as the source 216 for the block of memory cells $250_L$. For example, each block of memory cells $250_0$-$250_L$ can be commonly selectively connected to the source 216. Access lines 202 and select lines 214 and 215 of one block of memory cells 250 can have no direct connection to access lines 202 and select lines 214 and 215, respectively, of any other block of memory cells of the blocks of memory cells $250_0$-$250_L$.

The bitlines $204_0$-$204_M$ can be connected (e.g., selectively connected) to a buffer portion 240, which can be a portion of the page buffer of the memory device 130. The buffer portion 240 can correspond to a memory plane (e.g., the set of blocks of memory cells $250_0$-$250_L$). The buffer portion 240 can include sense circuits (which can include sense amplifiers) for sensing data values indicated on respective bitlines 204.

FIGS. 3A-3D are a set of graphs illustrating waveforms associated with a wordline voltage and a pillar voltage during the wordline ramp up to a pass voltage (Vpass) according to different embodiments. In these graphs, the "SGD" references the drain select line 215 of the memory array 200A or memory array 200B (FIGS. 2A-2B). Further, the "Vpass_far" and "Vpass_near" waveforms are associated with the trajectory of wordline (WL) ramping depending on how close a pillar (or channel) is along the WL from a signal driver, for example. Thus, the "Vpass_far" is the WL voltage ramp to Vpass for a pillar located farther away from the signal driver while "Vpass_near" is the WL voltage ramp to Vpass for a pillar located closer to the signal driver. Thus, the "Vpass_far" voltage waveform is naturally delayed and takes longer to reach Vpass than does the "Vpass_near" waveform.

Figure 3A:
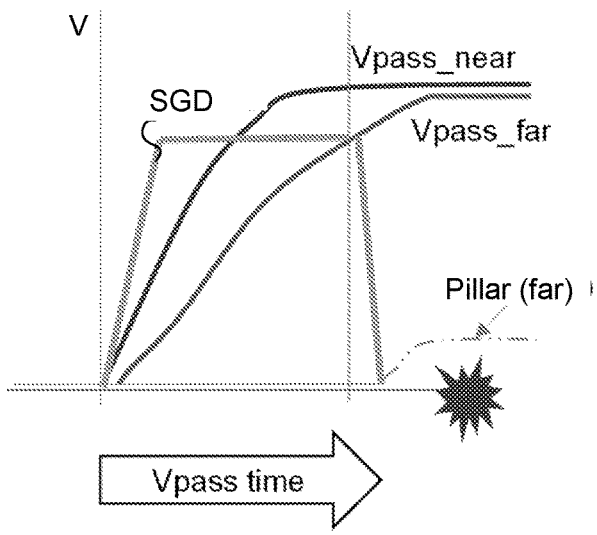
FIGS. 3A-3D are a set of graphs illustrating waveforms associated with a wordline voltage and a pillar voltage during the wordline ramp up to a pass voltage according to different embodiments.

FIG. 3A illustrates a first scenario in which the pillar is in a stable state when the Vpass time begins. For purposes of the present embodiments, the stable state indicates the pillar (or channel) of an array of memory cells is in a neutral state or at or close to zero volts. In the stable state, the pillar starts from ground (GND) and the drain select line 215 (SGD) and source select line 214 (SGS) turn on when the Vpass is higher (than would be if starting from a negative or transient state), and the full WL-pillar capacitance is loaded by a charge pump. In this situation, there is a potential hot-e risk because the pillar is boosted after the SGD is deasserted. As illustrated, this forces the pillar potential to a higher voltage, causing a hot-e risk with no intervening delay time.

Figure 3B:
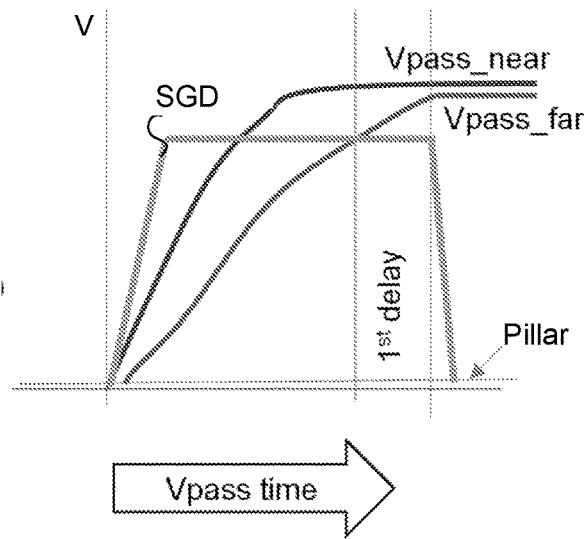

FIG. 3B illustrates a second scenario in which the pillar is in a stable state, but does not exhibit a hot-e risk because the pillar is coupled between the common source (SRC) 216 and bitline (BL) 204 before the SGD is turned off, thus not boosting the pillar potential because part of the capacitance of the pillar is loaded by the SRC/BL. In this scenario, the control logic causes a delay time (illustrated as $1^{st}$ delay) for a read access of the sub-block that includes the pillar, e.g., so has to extend to the "Vpass_far" voltage level. This delay time is automatically added in certain memory devices because the memory devices do not know if the sub-block being accessed is in a transient or a stable state, negatively impacting overall read access times.

Figure 3C:
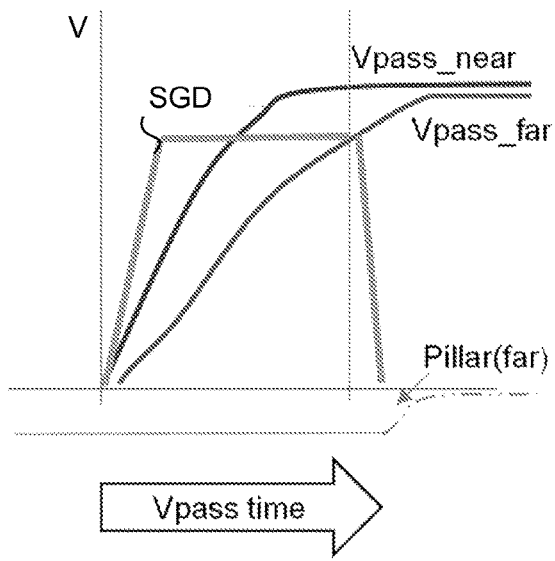

FIG. 3C illustrates a third scenario in which the pillar is in a transient state, e.g., when the pillar has a slightly negative voltage when the Vpass time begins. This slightly negative voltage can be a negative voltage up to a maximum programmed voltage in the string, e.g., if the maximum threshold voltage is a −4.5V, the pillar can go negative up to −4.5V as well. There is no hot-e risk in this third scenario because the pillar is boosted from that slightly negative voltage to a higher voltage, e.g., that is close to zero and thus neutral compared to the higher positive voltage when the pillar starts in a stable state. Accordingly, there is no need here for an intervening delay time.

Figure 3D:
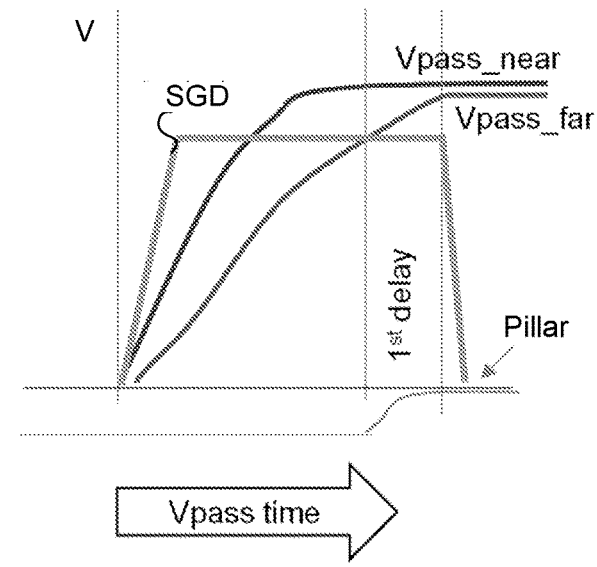

FIG. 3D illustrates a fourth scenario in which the pillar similarly is in a transient state when the Vpass time begins. In this scenario, there is also no hot-e risk because the pillar is coupled between the common source (SRC) 216 and bitline 204 before the SGD is turned off, thus not boosting the pillar potential. In this scenario, the control logic causes a delay time (illustrated as $1^{st}$ delay) for a read access of the sub-block that includes the pillar, e.g., so has to extend to the "Vpass_far" voltage level for some pillars. This delay time is automatically added in certain memory devices because the memory devices do not know if the sub-block being accessed is in a transient or a stable state, negatively impacting overall read access times.

Figure 4:
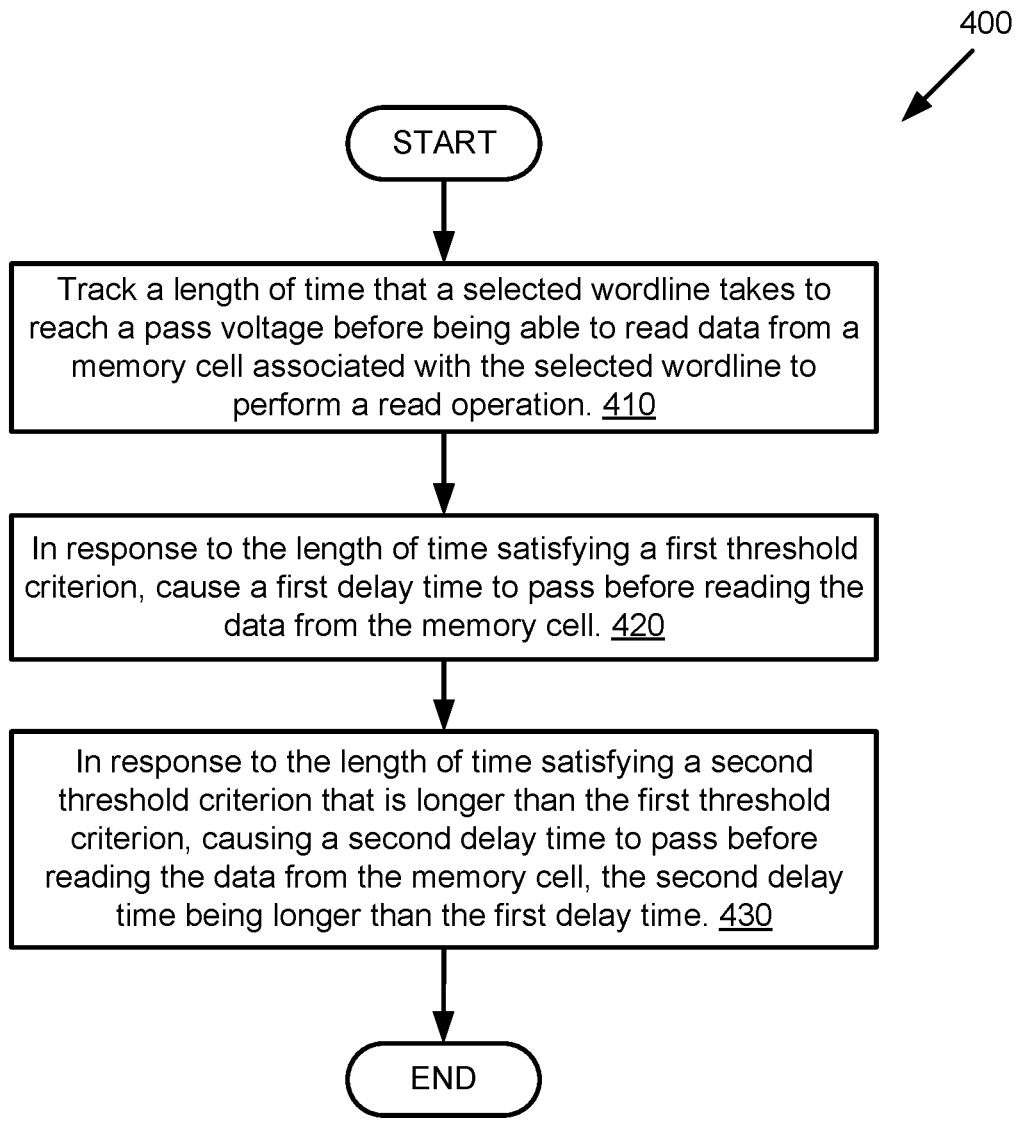
FIG. 4 is a flow diagram of a method for a memory device detecting a wordline state and adjusting a delay time before reading a memory cell based on the memory state according to some embodiments.

FIG. 4 is a flow diagram of a method 400 for a memory device detecting a wordline state and adjusting a delay time before reading a memory cell based on the memory state according to some embodiments. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the local media controller 135 (e.g., the read manager 138) of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the pass voltage (Vpass) time is tracked. More specifically, the processing logic tracks a length of time that a selected wordline takes to reach a pass voltage before being able to read data from a memory cell of a sub-block associated with the selected wordline. One implementation of operation 410 includes the processing logic starting the counter 136 upon beginning to ramp a voltage of the selected wordline and stopping the counter 136 in response to the selected wordline reaching a threshold percentage of the pass voltage. This percentage can be, for example, between 80 to 95+ percent of Vpass depending on how soon the trigger of the top is desired to be detected for purposes of adding a delay time to the Vpass period. In some embodiments, the processing logic employs a logic unit to detect the start for the counter 136 and the processing logic employs a detector or comparator to detect the wordline/pillar reaching the threshold percentage of Vpass. The processing logic can further read a value of the counter 136 to determine the length of time. For example, the counter 136 can be driven by a clock of the processing logic. By detecting this threshold percentage of the pass voltage, the memory device 130 can determine a state of the pillar.

At operation 420, a first delay time is applied. More specifically, in response to the length of time satisfying a first threshold criterion, the processing logic causes a first delay time to pass before reading the data from the memory cell.

At operation 430, a second delay time is applied. More specifically, in response to the length of time satisfying a second threshold criterion that is longer than the first threshold criterion, the processing logic causes a second delay time to pass before reading the data from the memory cell, the second delay time being longer than the first delay time. Further, as discussed in more detail with reference to FIG. 5, in some embodiments, the second delay time is a delay that is caused in response to a first read access of the sub-block after being programmed and the first delay time is a delay that is caused in response to read accesses of the sub-block that are subsequent to a first read access of the sub-block after being programmed. By selectively using a shorter delay time in most cases when reaching the Vpass voltage satisfies the second threshold criterion, the performance improvement can be between approximately 6-24% faster read access times depending on whether the memory cells are single-level cells (SLC) or triple-level cells (TLC).

In some embodiments, the operations of method 400 further include the processing logic comparing the length of time with time period values in a lookup table to determine whether the length of time satisfies at least one of the first threshold criterion or the second threshold criterion. In these embodiments, the first threshold criterion corresponds to the pillar starting at a negative voltage (e.g., in a transient state) and the second threshold criterion corresponds to the pillar starting at an approximately zero voltage (e.g., in a stable state). In some embodiments, the operations further include, in response to the length of time satisfying a third threshold criterion that is longer than the second threshold criterion, the processing logic causing a third delay time to pass before reading the data from the memory cell, the third delay time being longer than the second delay time. In this way, use of the lookup table or similar check can provide a means by which to determine a specific delay time of different granularity corresponding to a specific time to reach the Vpass voltage or threshold percentage of the Vpass voltage.

Figure 5:
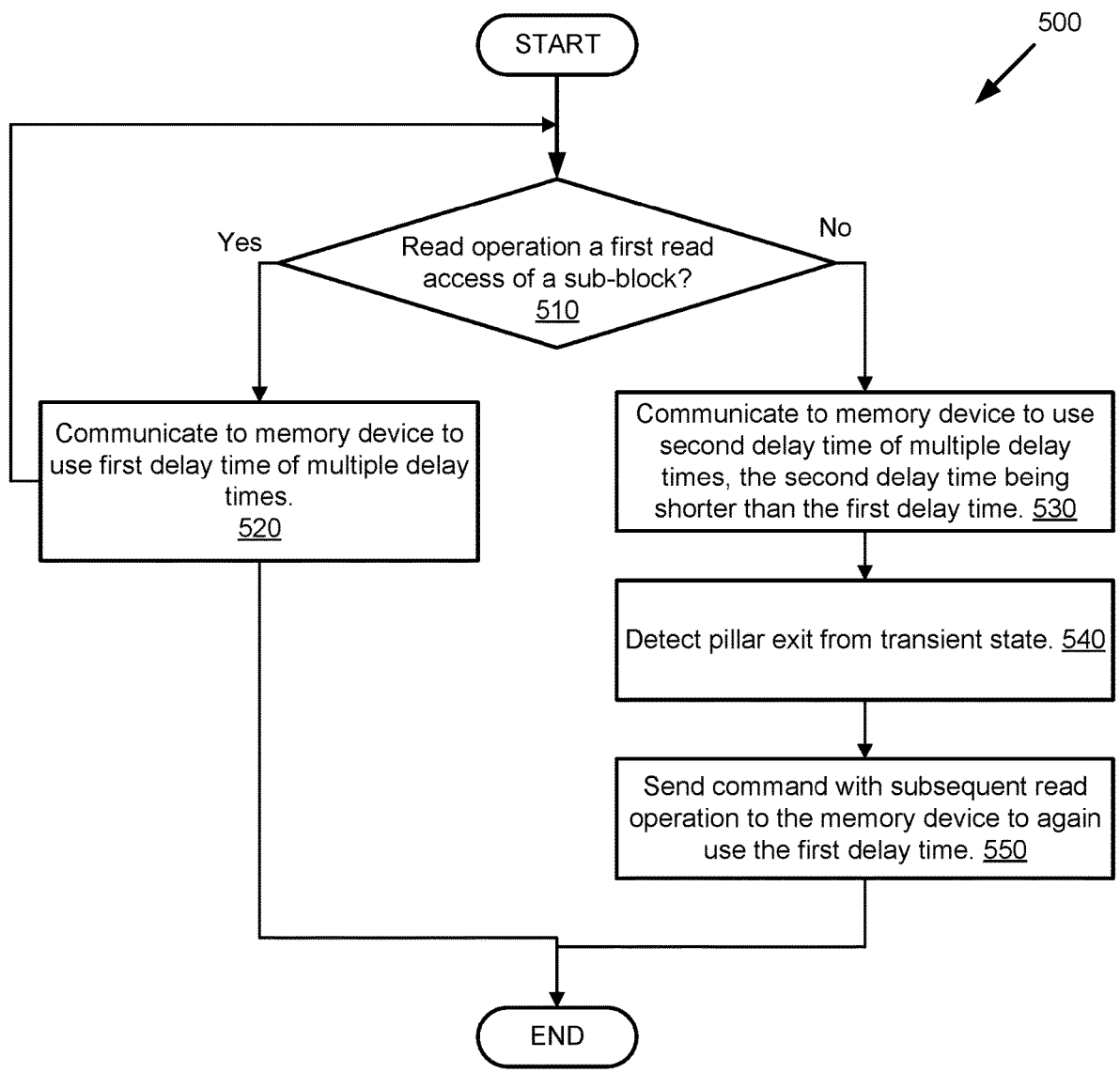
FIG. 5 is a flow diagram of a method for a memory controller of a memory sub-system tracking a state of pillar of a memory array in a coupled memory device and directing the memory device as to use of a particular delay time before reading a memory cell based on the state according to some embodiments.

FIG. 5 is a flow diagram of a method 500 for a memory controller of a memory sub-system tracking a state of pillar of a memory array in a coupled memory device and directing the memory device as to use of a particular delay time before reading a memory cell based on the state according to some embodiments. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the memory sub-system controller 115 (e.g., the operations manager 111) of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, a first read access is detected. More specifically, the processing logic determines whether a read operation performed on a memory cell of the sub-block is a first read access at the sub-block since being programmed. If the read operation is a first read access, at operation 520, the processing logic communicates to the memory device 130 to use a first delay time of multiple delay times after a selected wordline of the memory cell has reached a pass voltage and before reading data from the memory cell. The first delay time, for example, can be the same or similar delay to the first delay time discussed with reference to the method 400 of FIG. 4.

In these embodiments, if, at operation 510, the read operation is not a first read access of the sub-block, then, at operation 530, the processing logic communicates to the control logic (e.g., local media controller 135) to use a second delay time, of the multiple delay times, after the selected wordline of a selected memory cell has reached the pass voltage and before reading data from the selected memory cell. In at least some embodiments, the second delay time is shorter than the first delay time. In some embodiments, the processing logic determines that the read operation is a second read operation performed on the sub-block, where the second read operation corresponds to a second read access of the sub-block.

As discussed previously with reference to FIG. 2B, in some embodiments, the memory cells of the sub-block are associated with a pillar of the sub-block. Further, the second delay time is associated with a transient state of the pillar, which is often endeavored to be maintained for better read window budget (RWB) between threshold voltage distributions and uses a lower delay time because the hot-e risk is lower when the pillar of channel is in this transient (or slightly negative) state.

At operation 540, a pillar state exit is detected. More specifically, the processing logic detects the pillar exit from the transient state. At operation 550, an updated delay time is directed for use. More specifically, the processing logic sends, together with a subsequent read operation, a command to the control logic to again use the first delay time. In these embodiments, the detecting the pillar exit from the transient state includes one of: detecting a reset of the voltage of the pillar or detecting a period of time pass that is associated with the pillar returning to an approximately zero voltage. In some embodiments, the passage of time, high temperature (e.g., detecting the memory device 130 satisfy a threshold temperature), or an erase performed in another block of the same plane could cause also the exit of the sub-block from the transient state.

Figure 6:
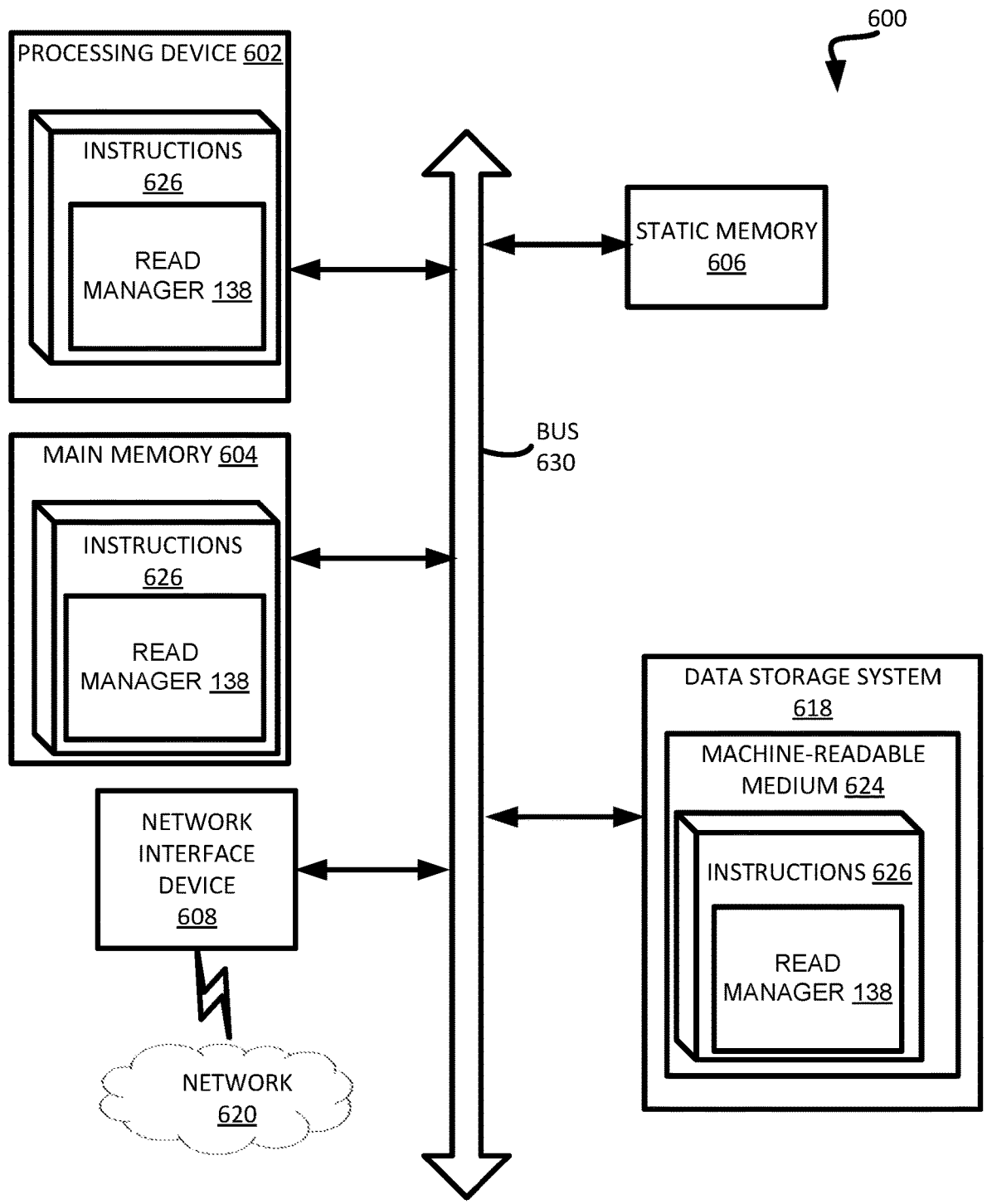
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1A) that includes, is coupled to, or utilizes a memory sub-system (e.g., the memory sub-system 110 of FIGS. 1A-1B) or can be used to perform the operations of a controller (e.g., to execute an operating system to perform operations corresponding to operations manager 111 and/or read manager 138 of FIGS. 1A-1B). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium, such as a non-transitory computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1A.

In one embodiment, the instructions 626 include instructions to implement functionality corresponding to operations manager 111 and/or read manager 138 of FIGS. 1A-1B). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium (e.g., non-transitory computer-readable storage medium), such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
   an array of memory cells comprising multiple sub-blocks, wherein memory cells of a sub-block are coupled to a pillar of the array and are associated with multiple wordlines; and
   control logic operatively coupled with the array, wherein the control logic, in performing a read operation, is to perform operations comprising:
      tracking a length of time that a selected wordline takes to reach a pass voltage before being able to read data from a memory cell associated with the selected wordline;
      in response to the length of time satisfying a first threshold criterion, causing a first delay time to pass before reading the data from the memory cell; and
      in response to the length of time satisfying a second threshold criterion that is longer than the first threshold criterion, causing a second delay time to pass before reading the data from the memory cell, the second delay time being longer than the first delay time.

2. The memory device of claim 1, further comprising a counter, wherein tracking the length of time comprises:
   starting the counter upon beginning to ramp a voltage of the selected wordline; and
   stopping the counter in response to the selected wordline reaching a threshold percentage of the pass voltage.

3. The memory device of claim 2, wherein the operations further comprise reading a value of the counter to determine the length of time.

4. The memory device of claim 1, wherein the operations further comprise comparing the length of time with time period values in a lookup table to determine whether the length of time satisfies at least one of the first threshold criterion or the second threshold criterion.

5. The memory device of claim 1, wherein the first threshold criterion corresponds to the pillar starting at a negative voltage.

6. The memory device of claim 1, wherein the second threshold criterion corresponds to the pillar starting at an approximately zero voltage.

7. The memory device of claim 1, wherein the operations further comprise, in response to the length of time satisfying a third threshold criterion that is longer than the second threshold criterion, causing a third delay time to pass before reading the data from the memory cell, the third delay time being longer than the second delay time.

8. The memory device of claim 1, wherein the second delay time comprises a delay that is caused in response to a first read access of the sub-block after being programmed.

9. The memory device of claim 1, wherein the first delay time comprises a delay that is caused in response to read accesses of the sub-block that are subsequent to a first read access of the sub-block after being programmed.

10. A system comprising:
a memory device comprising an array of memory cells, the array of memory cells comprising multiple sub-blocks, wherein memory cells of a sub-block are associated with multiple wordlines; and
a processing device operatively coupled with the memory device, the processing device to perform operations comprising:
determining that a read operation performed on a memory cell of the sub-block is a first read access of the sub-block since being programmed; and
communicating to control logic of the memory device to use a first delay time, of multiple delay times, after a selected wordline of the memory cell has reached a pass voltage and before reading data from the memory cell.

11. The system of claim 10, wherein the operations further comprise:
determining that a second read operation performed on the sub-block is a second read access of the sub-block; and
communicating to the control logic to use a second delay time, of the multiple delay times, after the selected wordline of a selected memory cell has reached the pass voltage and before reading data from the selected memory cell, wherein the second delay time is shorter than the first delay time.

12. The system of claim 11, wherein the memory cells of the sub-block are associated with a pillar of the sub-block, the second delay time is associated with a transient state of the pillar, and wherein the operations further comprise:
detecting the pillar exit from the transient state; and
sending, together with a subsequent read operation, a command to the control logic to again use the first delay time.

13. The system of claim 12, wherein the detecting the pillar exit from the transient state comprises one of:
detecting a reset of the voltage of the pillar;
detecting the memory device satisfy a threshold temperature; or
detecting a period of time pass that is associated with the pillar returning to an approximately zero voltage.

14. A method comprising:
tracking, by control logic of a memory device that includes a sub-block of memory cells with which are associated multiple wordlines, a length of time that a selected wordline takes to reach a pass voltage before being able to read data from a memory cell associated with the selected wordline to perform a read operation;
in response to the length of time satisfying a first threshold criterion, causing, by the control logic, a first delay time to pass before reading the data from the memory cell; and
in response to the length of time satisfying a second threshold criterion that is longer than the first threshold criterion, causing, by the control logic, a second delay time to pass before reading the data from the memory cell, the second delay time being longer than the first delay time.

15. The method of claim 14, further comprising:
starting a counter upon beginning to ramp a voltage of the selected wordline;
stopping the counter in response to the selected wordline reaching a threshold percentage of the pass voltage; and
reading a value of the counter to determine the length of time.

16. The method of claim 14, further comprising comparing the length of time with time period values in a lookup table to determine whether the length of time satisfies at least one of the first threshold criterion or the second threshold criterion.

17. The method of claim 14, wherein the first threshold criterion corresponds to a pillar of the sub-block starting at a negative voltage, and wherein the second threshold criterion corresponds to the pillar starting at an approximately zero voltage.

18. The method of claim 14, further comprising, in response to the length of time satisfying a third threshold criterion that is longer than the second threshold criterion, causing a third delay time to pass before reading the data from the memory cell, the third delay time being longer than the second delay time.

19. The method of claim 14, wherein the second delay time comprises a delay that is caused in response to a first read access of the sub-block after being programmed.

20. The method of claim 14, wherein the first delay time comprises a delay that is caused in response to read accesses of the sub-block that are subsequent to a first read access of the sub-block after being programmed.

* * * * *